United States Patent [19]
Miura

[11] Patent Number: 5,017,841
[45] Date of Patent: May 21, 1991

[54] FM DEMODULATOR
[75] Inventor: Katsunori Miura, Osaka, Japan
[73] Assignee: Sanyo Electric Co., Ltd., Moriguchi, Japan
[21] Appl. No.: 522,937
[22] Filed: May 14, 1990
[30] Foreign Application Priority Data
 May 16, 1989 [JP] Japan .................................. 1-122360
[51] Int. Cl.$^5$ .............................................. H03D 3/00
[52] U.S. Cl. ..................................... 329/325; 455/260
[58] Field of Search .................. 329/325, 326; 331/23; 375/120; 455/260

[56] References Cited
U.S. PATENT DOCUMENTS
4,472,685 9/1984 Dutasta ............................... 329/325
4,605,904 8/1986 Hajj-Chehade ..................... 329/325

FOREIGN PATENT DOCUMENTS
63-58602 3/1988 Japan .

Primary Examiner—Robert J. Pascal
Attorney, Agent, or Firm—Armstrong, Nikaido, Marmelstein, Kubovcik & Murray

[57] ABSTRACT

A FM signal is applied to a variable gain amplifier (5) of an FM demodulator. The gain of variable gain amplifier (5) is varied in response to a gain control signal. The output signal of variable gain amplifier (5) is applied to an FM demodulating circuit (7) constituting a PLL circuit via a BPF (6). The output signal of BPF (6) is also applied to a synchronous detector (12) via a 90° fixed phase shifter (11). The output signal of a VCO (10) included in the PLL circuit is applied to synchronous detector (12) as the reference signal. The synchronous detector (12) is responsive to the reference signal for synchronous detecting the output signal of 90° fixed phase shifter (11). The output signal of synchronous detector (12) is applied to variable gain amplifier (5) via a LPF (13) as the gain control signal. Thus, variable gain amplifier (5) is responsive to the output signal of synchronous detector (12) for making the amplitude of the FM audio signal included in the FM signal constant.

9 Claims, 5 Drawing Sheets

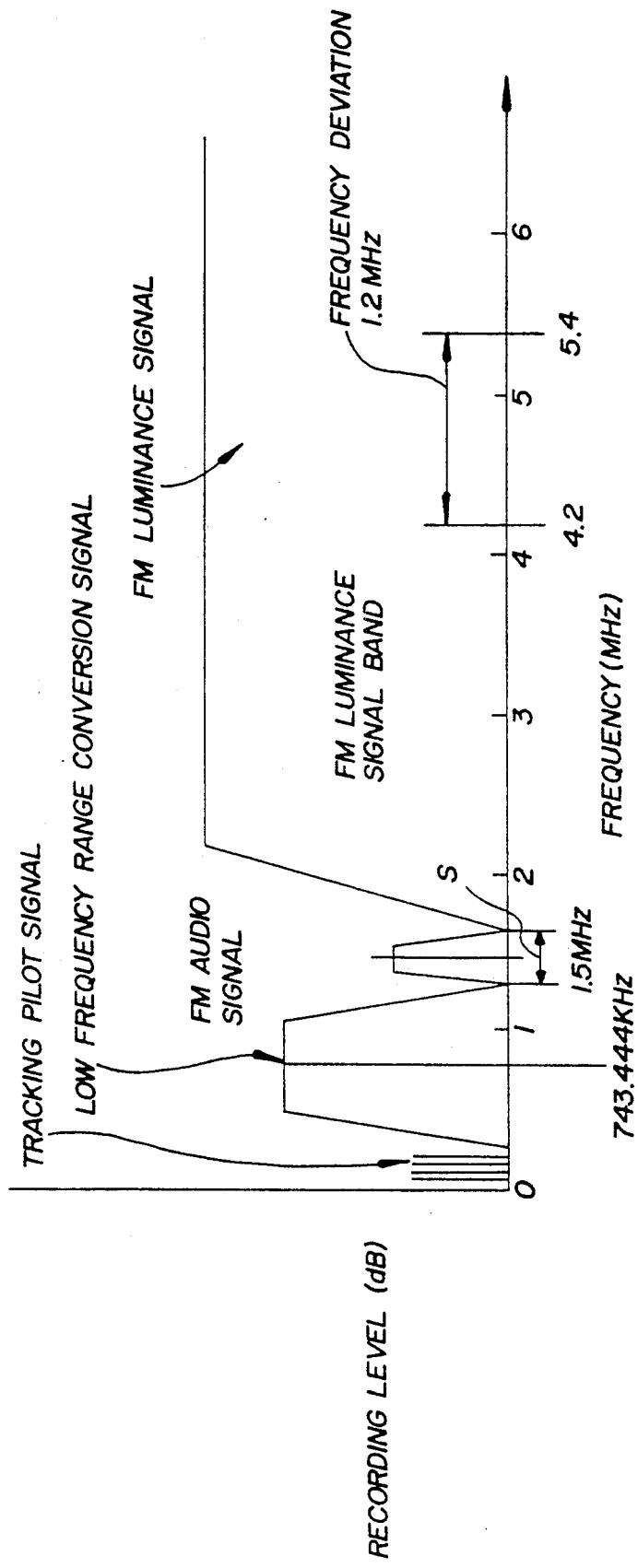
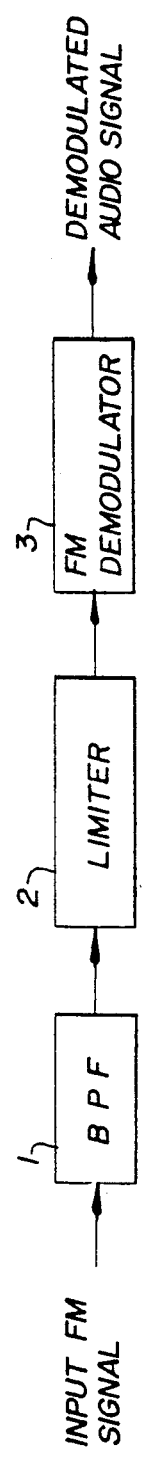

FM DEMODULATOR

BACKGROUND OF THE INVENTION

1. Field of Invention

The invention relates generally to FM demodulators, and more particularly, to FM demodulators for reproducing FM signals recorded on magnetic tapes and disks.

2. Description of the Background Art

In the so-called 8 mm VTRs and optical video disk players, various types of signals such as video signals and audio signals are FM demodulated and recorded in mutual superimposition on the recording medium of magnetic tapes and optical disks. The frequency spectrum of a recorded signal on a magnetic tape of a 8 mm VTR is shown in FIG. 1, for example. It can be seen from FIG. 1 that a pilot signal, a low frequency range conversion color signal, an FM audio signal and an FM luminance signal constituted by four frequencies for tracking are frequency multiplexed, each using a predetermined frequency band. In the case where a recorded signal having such a frequency spectrum is reproduced and a desired signal, an FM audio signal for example, is to be separated, the lower limit of the FM luminance signal and the upper limit of the low frequency range conversion signal are so close to the band of the FM audio signal that the extraction of the FM audio signal by a band pass filter filter (hereinafter referred to as BPF) becomes critical.

Thus, for the general reproduction of FM signals not limited to a 8 mm VTR, the circuit shown in FIG. 2 is utilized. The cut off frequency of a BPF 1 is previously set to the band of a desired signal, for example, the frequency of an FM audio signal. An input FM signal from a reproduction head is provided to BPF 1, so that only the FM audio signal is extracted. This FM audio signal is provided to a limiter 2, where the AM component included in the FM audio signal is removed. Then, the FM audio signal is FM demodulated at an FM demodulator 3 to obtain a demodulated audio signal. The limiter 2 has the function to make the amplitude of the FM signal constant, while performing high gain amplification. The reason why this function is necessary will be explained hereinafter.

When a classical FM demodulator such as of a Foster-Seeley type is used for FM demodulation, the demodulator itself will operate as an FM demodulator as well as an AM detector. Therefore, the AM component will directly be accepted as a noise. When an FM demodulator using a digital circuit, such as a pulse count type FM demodulator is used, the necessity of digitizing the input FM signal occurs. Therefore, it is customary to use a limiter in an FM demodulator.

However, to interpose a limiter 2 between BPF 1 and FM demodulator 3, as shown in FIG. 2, interferes with the function of BPF 1. BPF 1 has the function to distinguish the objective signal from other signals and extracts the objective signal. In other words, BPF 1 has the function to change the amplitude depending on the frequency. On the contrary, limiter 2 attempts to make the amplitude constant regardless of the frequency.

It is assumed that BPF 1 has the characteristic shown by the solid line L1 of FIG. 3. Due to the effect of limiter 2, the high amplitude component is suppressed, while the low amplitude component is enhanced. Consequently, the characteristic of the FM signal passing limiter 2, i.e., the characteristic of the effective BPF is such as shown in the broken line L2 of FIG. 3. Therefore, when the FM demodulation method of FIG. 2 is employed in a 8 mm VTR, it would be impossible to completely remove the upper and lower video signals, namely the FM luminance signal and the low frequency range color signal, resulting in buzz disturbance even if a superior characteristic BPF is used.

Recently, a PLL-FM demodulator employing a phase locked loop (PLL) circuit comprised of a phase comparator, a low pass filter (hereinafter referred to as LPF), and a voltage controlled oscillator (hereinafter referred to as VCO) is used, as disclosed in Japanese Patent Laying-Open No. 62-20486. Since a PLL circuit does not respond to the AM component in principle, a limiter is unnecessary. However, in practice, the PLL circuit will respond to the AM component to some extent, and the AM suppression ratio is about 30-40 dB. Particularly in 8 mm VTRs, an output difference between two heads is liable to occur, with the effect of the AM component appearing significantly in the low frequency range. Accordingly, an amplitude limiting means such as a limiter will be necessary, but this application of a limiter will generate the aforementioned problems.

A reproduction output circuit employing a gain controlling circuit for obtaining an FM signal with a constant amplitude is disclosed in Japanese Patent Laying-Open No. 63-58602. With this reproduction output circuit, the amplitude of an input FM signal is detected by envelope detection, and the gain in the gain controlling circuit is controlled using this detected result. Thus, a constant amplitude can be obtained.

However, since the frequency is not distinguished in envelope detection, the envelope detection AGC (automatic gain control) will attempt to make the amplitude constant irrespective of the frequency. Therefore, it can be said that the function of the envelope detection AGC interferes with the function of the BPF, though not to the extent in the event of a limiter.

The case where an interference wave v from a video signal is superimposed upon an FM audio signal s is considered, as shown in FIG. 4A. FIG. 4B shows the instance where an FM audio signal is envelope detected. When the gain of a gain controlling circuit is controlled by the signal of FIG. 4B, the amplitude of the FM audio signal provided from the gain controlling circuit is not constant due to the interference wave from the video signal, as shown in FIG. 4C.

SUMMARY OF THE INVENTION

An object of the present invention is to provide an FM demodulator having the function to make the amplitude of a desired FM signal constant without being affected by an interference wave.

Another object of the invention is to enable the extraction of a desired FM signal without deteriorating the characteristic of the BPF in an FM demodulator.

A further object of the invention is to provide an FM demodulator and an FM demodulating method for extracting a desired FM signal while reducing buzz disturbance.

An FM demodulator in accordance with the present invention comprises a variable gain amplifier, a filter, a phase locked loop circuit, and a synchronous detector. The variable gain amplifier receives an FM signal and changes its gain in response to a predetermined control signal. The filter will pass a predetermined band component of the output signal from the variable gain amplifier. The phase locked loop circuit comprises a voltage controlled oscillator, and FM demodulates the output signal from the filter. The synchronous detector is responsive to the output signal from the voltage controlled oscillator for synchronous detecting the output from the filter. Then this synchronous detected signal will be provided to the variable gain amplifier as a predetermined control signal for making the predetermined band amplitude of an FM signal constant.

With this case FM demodulator, a predetermined band component is synchronous detected by a synchronous detector, and the gain of the variable gain amplifier is controlled in response to the synchronous detected output signal. Therefore, the variable gain amplifier performs control so that the predetermined band component amplitude of the FM signal will be constant. Hence, it will be possible to make a predetermined band component amplitude of an FM signal constant without using a limiter.

In this case, extraction of the desired FM signal is performed without deteriorating the characteristic of the filter in relation with the amplitude limitation, and buzz disturbance is reduced. Also, since the phase locked loop circuit itself is one type of filter, the capability to remove disturbance is further improved.

In addition, by interposing a filter within a AGC loop comprised of a variable gain amplifier and a synchronous detector, the maximum input amplitude of the FM signal to be provided to the filter will be limited. Furthermore, it is possible to maintain the input to the filter constant so that sufficient SN ratio is ensured even when an active filter having a noise generating factor in itself is employed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing the frequency spectrum of a 8 mm VTR recorded signal.

FIG. 2 is a block diagram showing the structure of a conventional FM demodulator system.

DESCRIPTION OF THE PREFERRED EMBODIMENTS

An embodiment of the present invention will be explained in detail with reference to the drawings.

Figure 3:
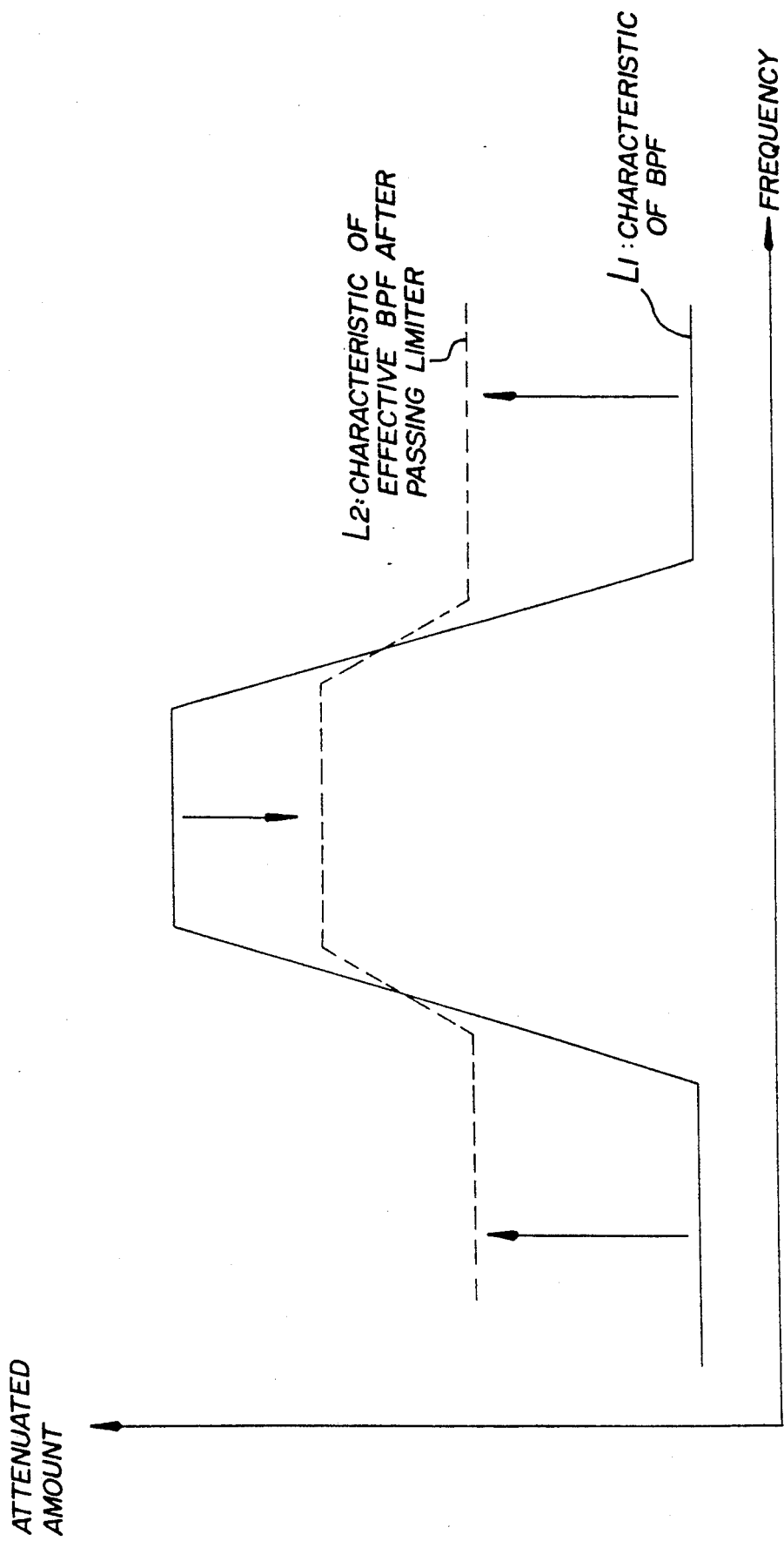
FIG. 3 is a diagram showing the characteristic of a BPF.
Figure 4A:
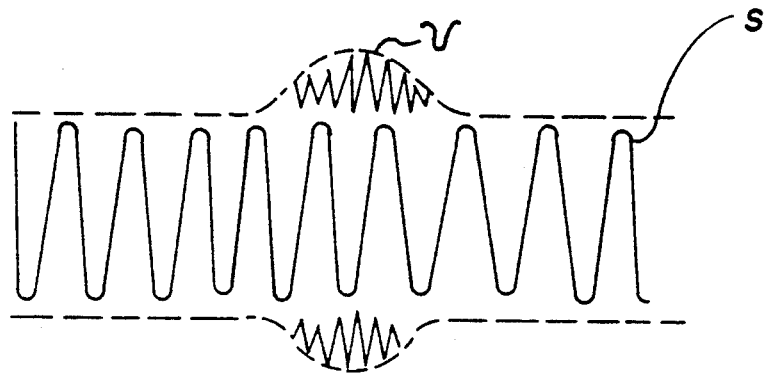
FIGS. 4A, 4B and 4C are waveform diagrams for explaining the operation of a conventional reproduction output circuit.
Figure 4B:
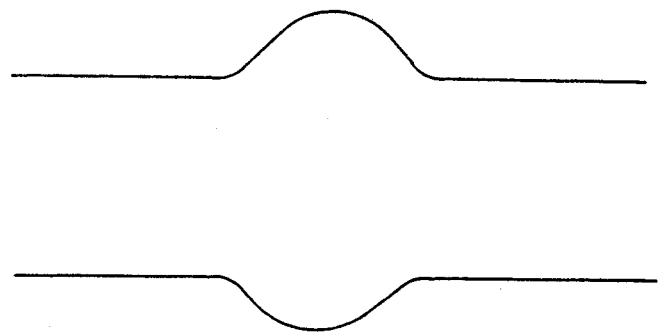
Figure 4C:
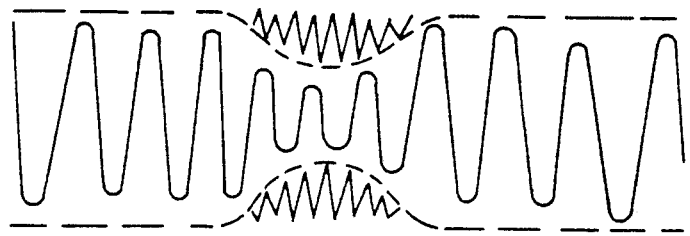
Figure 5:
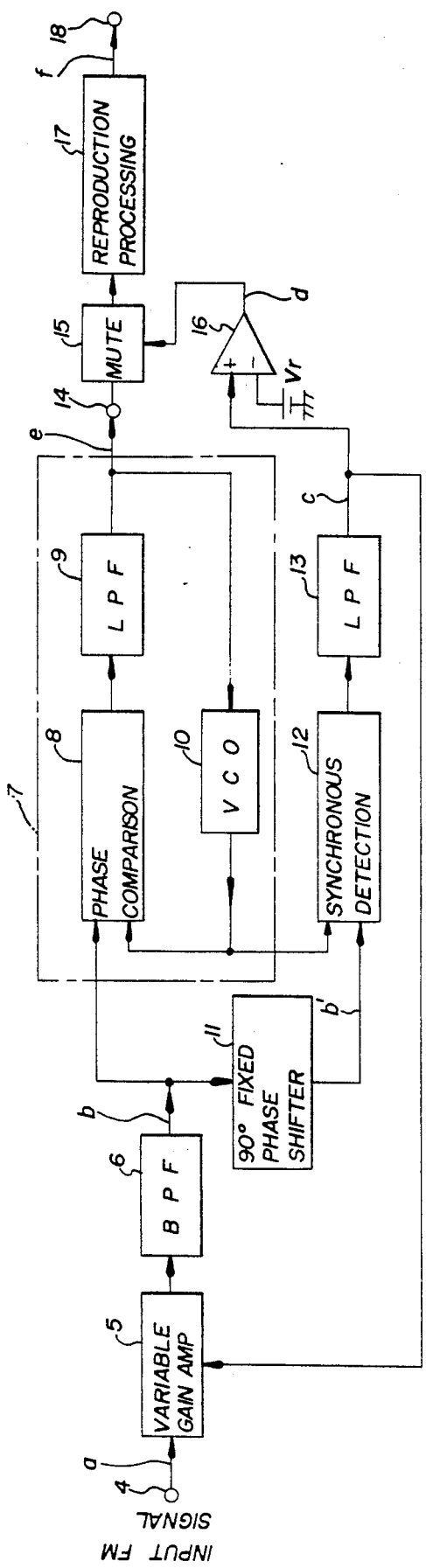
FIG. 5 is a block diagram showing the structure of an FM demodulator in accordance with one embodiment of the present invention.
Figure 6A:
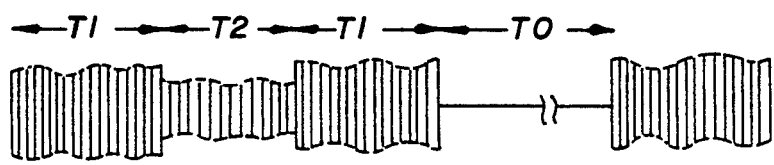
FIGS. 6a through 6f are waveform diagrams for explaining the operation of the FM demodulator of FIG. 5.
Figure 6B:
Figure 6C:
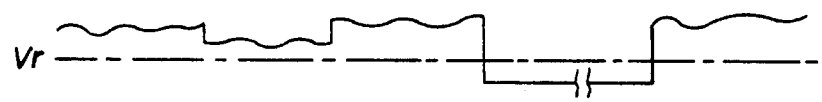
Figure 6D:
Figure 6E:
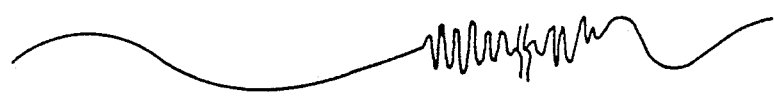
Figure 6F:

In FIG. 5, a reproduced FM composite signal including an FM video signal and an FM audio signal is provided to the input terminal 4 as an input FM signal. This input FM signal is applied to a variable gain amplifier 5 for making the amplitude of the FM audio signal constant. The amplitude of an FM audio signal included in the input FM signal is made constant by variable gain amplifier 5 constituting a part of a AGC loop, before input to an FM demodulating circuit 7 in the succeeding stage. The gain in variable gain amplifier 5 is controlled by a gain control signal obtained by the later explained synchronous detector 12 and LPF 13. The output signal of variable gain amplifier 5 is provided to a BPF 6.

The cut off frequency of BPF 6 is set to a desired signal band. Considering the case where the FM audio signal within the recorded signal having the frequency spectrum of FIG. 1 is extracted, the band of the cut off frequency is set as shown by S of FIG. 1. The FM audio signal executed from the FM signal by the BPF 6 is applied to the FM demodulating circuit 7 and a 90° fixed phase shifter 11.

The FM demodulating circuit 7 comprises a phase comparator 8, a LPF 9, and a voltage controlled oscillator (VCO) 10. The FM audio signal from BPF 6 is provided to one input terminal of phase comparator 8, while the output signal from VCO 10 is applied to the other input terminal thereof. The phase comparator 8 compares the phases of the signals applied to the two input terminals and provides a phase error signal corresponding to the phase difference to the output terminal 14 via LPF 9. Also this phase error signal is applied to VCO 10 as a control signal. Thus, a frequency negative feedback loop is constituted. The LPF 9 extracts the low frequency range component of the phase error signal provided from phase comparator 8. The oscillating frequency of VCO 10 is controlled in response to the voltage level of the phase error signal provided from LPF 9.

In the above manner, FM demodulating circuit 7 comprising phase comparator 8, VCO 10 and LPF 9 forms a PLL circuit. VCO 10 oscillates so that 1.5 MHz of the carrier frequency of the FM audio signal becomes the center frequency. Accordingly, this PLL circuit is locked at 1.5 MHz which is the carrier frequency of the audio signal.

When the PLL circuit is in a locked state, the output frequency of VCO 10 follows the instantaneous frequency of the FM audio signal applied to phase comparator 8. Therefore, the output signal from LPF 9 alters so that the frequency of the output signal from VCO 10 is locked to the frequency of the FM audio signal. Eventually, the output signal from LPF 9 is provided to the output terminal 14 as an FM demodulated audio signal.

Meanwhile, the FM audio signal provided to 90° fixed phase shifter 11 is phase-shifted by 90°. The output signal from VCO 10 is applied to one input terminal of a synchronous detector 12 as a reference signal. To the other input terminal of synchronous detector 12, the FM audio signal from 90° fixed phase shifter 11 is provided. The synchronous detector 12 detects the FM audio signal in synchronism with the frequency of the reference signal.

The synchronous detector 12 and phase comparator 8 are both comprised of an analog multiplier. These analog multipliers are both formed by a monolithic IC and have the same circuit structure. These analog multipliers will output a signal of the maximum level when the phase difference between the input signals is 0°, and will output a signal of the 0° level when the phase difference is 90°. Since the PLL circuit will operate so that the output level of phase comparator 8 (analog multiplier) is 0 when the PLL is in the locked state, the FM audio signal and the output signal from VCO 10 are locked with a 90° phase difference.

Correspondingly, synchronous detector 12 will operate as an AM detector for the objective frequency when the phase difference between the two input signals is 0°. For this reason, the 90° fixed phase shifter 11 is interposed between BPF 6 and synchronous detector 12 to previously shift the FM audio signal by 90°. Consequently, both the input signals of the synchronous detector 12 are in synchronism, whereupon the synchronous detector 12 will operate as an AM detector in synchronism with the frequency of the FM audio signal at that time. In other words, synchronous detector 12 functions as an amplitude detector for the FM audio signal having synchronized frequency. The amplitude detected output signal from synchronous detector 12 is applied to LPF 13 so that the low frequency range component of that output signal is provided to variable gain amplifier 5 as the gain control signal.

When the amplitude of the FM audio signal provided to variable gain amplifier 5 is small, the level of the gain control signal from LPF 13 is low. In the case where the level of the gain control signal is low, the variable gain amplifier 5 is controlled to provide large gain. Conversely, when the amplitude of the FM audio signal applied to variable gain amplifier 5 is large, the level of the gain control signal from LPF 13 is high. In the case where the level of the gain control signal is high, the variable gain amplifier 5 is controlled to provide small gain. In this way, the gain of variable gain amplifier 5 changes instantaneously depending on the output from synchronous detector 12, namely the amplitude level of the FM audio signal. Thus, the amplitude of the FM audio signal is always maintained constant, and the effect of the AM component in FM demodulating circuit 7 is suppressed.

Furthermore, since the BPF 6 is provided within the AGC loop comprised of the variable gain amplifier 5, the synchronous detector 12 and the LPF 13, the maximum input amplitude of the signal provided to BPF 6 is limited.

A muting circuit 15 is connected to the output terminal 14 of FM demodulating circuit 7. The gain control signal from LPF 13 is also applied to a comparator 16. The comparator 16 compares the gain control signal with a predetermined reference voltage Vr and provides the compared result to muting circuit 15 as a control signal. The output signal of muting circuit 15 is provided to the output terminal 18 through a predetermined reproduction processing circuit 17.

Next, the operation of the FM demodulator of FIG. 5 will be explained in reference to the waveform of FIG. 6.

Through input terminal 4, an FM signal a is provided to variable gain amplifier 5. The FM signal a has two time periods T1 and T2 alternately appearing depending on the characteristic of two heads with the azimuth angle differing from each other The amplitude of the FM audio signal b from BPF 6 is made constant by the function of the AGC loop constituted by variable gain amplifier 5, BPF 6, 90° fixed phase shifter 11, synchronous detector 12, and LPF 13. The output signal b' from 90° fixed phase shifter 11 has a waveform similar to that of the FM audio signal b, except that the phase is shifted by 90°.

Synchronous detector 12 detects the frequency component of the FM audio signal included in the output signal of 90° fixed phase shifter 11. This results in a gain control signal c provided from LPF 13. When an FM audio signal is not included in the FM signal, the level of the gain control signal c will become zero (time period T0).

The gain control signal c is compared with the reference voltage Vr by comparator 16. When the level of the gain control signal c is higher than the reference voltage Vr, the level of the output signal d from comparator 16 is zero. When the level of the gain control signal c is lower than the reference voltage Vr, the level of the output signal d from comparator 16 is high.

Meanwhile, a demodulated audio signal e is provided from FM demodulating circuit 7. At time period T0 where the FM audio signal is not included in these FM signal, noise is superimposed on the demodulated audio signal e. The muting circuit 15 operates to prevent the passing of the demodulated audio signal when the output signal d from comparator 16 is at the high level. Consequently, during time period T0 where the FM audio signal is not included in the FM signal, the level of the reproduced audio signal f provided from reproduction output circuit 17 is 0.

Thus, muting circuit 15 will operate during the period where the FM audio signal is not included in the FM signal to prevent the reproduction of the noise.

In the above emdodiment, a reference signal that is synchronized with the frequency to be detected, namely the frequency of the FM audio signal, is necessary during synchronous detection. To produce this reference signal, a PLL circuit will be required, to become a more expensive method compared with simple envelope detectors considering the existence of a PLL circuit. However, as shown in FIG. 5, since there is already the FM demodulating circuit 7 as a PLL circuit, only 90° fixed phase shifter 11 is to be added.

In the inventive embodiment, the function between the AGC and BPF 6 do not conflict, for a synchronous detection AGC is employed. Accordingly, it is possible to provide BPF 6 within the AGC loop.

With ordinary 8 mm VTRs, noise elimination operation will be necessary when reproducing a magnetic tape portion where the FM audio signal is not recorded. In the above embodiment, the gain control signal c from LPF 13 is used to discriminate the portion where the FM audio signal is not recorded. By monitoring this gain control signal c and controlling muting circuit 15 with the output signal d from comparator 16, reliable noise elimination operation will be performed without being disturbed by the video signal.

Furthermore, since the above embodiment may have BPF 6 constituted by active devices, it is possible to implement the circuit block of FIG. 5 with a monolithic IC having a plurality of condensers externally connected. This leads to a significant reduction in the cost.

In accordance with the above mentioned embodiment, when the cut off frequency of the BPF is set to the band of the FM audio signal, a demodulated audio signal may be obtained. When the cut off frequency of the BPF is set to the band of the FM luminance signal, a demodulated luminance signal may be obtained from the output terminal 14 by the same circuit.

The FM demodulator of the inventive embodiment may be used in applications where a bilingual FM signal or a stereo signal is to have one of their different frequency signals extracted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An FM demodulator for demodulating a predetermined band component of an FM signal comprising:
   variable gain amplifier means receiving said FM signal for varying its gain in response to a predetermined control signal,
   filter means for passing a predetermined band component of the output signal of said variable gain amplifier means,
   phase locked loop means including voltage controlled oscillator means for FM demodulating the output signal of said filter means, and
   synchronous detection means responsive to the output signal of said voltage controlled oscillator means for detecting synchronization of the output signal of said filter means with said output signal of said voltage controlled oscillator means and amplitude detecting the synchronized output signal of said filter means to supply an amplitude-detected signal as said predetermined control signal to said variable gain amplifier means so that the amplitude of said predetermined band component of said FM signal may be constant.

2. The FM demodulator according to claim 1, wherein
   said phase locked loop means further comprises phase comparing means for comparing the phase of the output signal of said filter means with the phase of the output signal of said voltage controlled oscillator means to output a signal having a voltage corresponding to the phase difference,
   said voltage controlled oscillator means provides the signal with the corresponding frequency in response to the output signal of said phase comparing means.

3. The FM demodulator according to claim 2, wherein said phase locked loop means further comprises
   a first low pass filter means provided between said phase comparing means and said voltage controlled oscillator means for passing a predetermined low frequency component of the output signal of said phase comparing means.

4. The FM demodulator according to claim 3, further comprising:
   a second low pass filter means provided between said synchronous detection means and said variable gain amplifier means for passing a predetermined low frequency component of the output signal of said synchronous detection means.

5. The FM demodulator according to claim 1, further comprising:
   phase shifting means for phase shifting the output signal of said filter means and providing the same to said synchronous detection means.

6. The FM demodulator according to claim 4, further comprising:
   muting means for providing the output signal of said first low pass filter means when the level of the output signal of said second low pass filter means is higher than a predetermined level.

7. The FM demodulator according to claim 6, further comprising comparing means for comparing the level of the output signal of said second low pass filter means with a predetermined level to provide the compared result,
   and wherein said muting means operates in response to the output signal of said comparing means.

8. The FM demodulator according to claim 1, wherein
   said filter means comprises of an active filter.

9. A method for demodulating a predetermined band component of an FM signal comprising the steps of:
   varying the amplitude of said FM signal in response to a predetermined control signal,
   passing a predetermined band component of said amplitude varied FM signal,
   FM demodulating said band component with a phase locked loop including voltage controlled oscillator means, and
   detecting synchronization of said band component with said output signal of said voltage control oscillator means and amplitude-detecting the synchronized band component to supply an amplitude-detected signal as said predetermined control signal so that the amplitude of said predetermined band of the FM signal may be constant.

* * * * *